(12) United States Patent
Munakata et al.

(10) Patent No.: US 11,774,511 B2
(45) Date of Patent: Oct. 3, 2023

(54) BATTERY PERFORMANCE EVALUATION METHOD AND BATTERY PERFORMANCE EVALUATION DEVICE

(71) Applicant: Toyo System Co., Ltd., Fukushima (JP)

(72) Inventors: Ichiro Munakata, Fukushima (JP); Shuntaro Igari, Fukushima (JP); Hideki Shoji, Fukushima (JP)

(73) Assignee: TOYO SYSTEM CO., LTD., Fukushima (JP)

(*) Notice: Subject to any disclaimer, the term of this patent is extended or adjusted under 35 U.S.C. 154(b) by 0 days.

(21) Appl. No.: 17/438,721

(22) PCT Filed: Dec. 16, 2020

(86) PCT No.: PCT/JP2020/046937
§ 371 (c)(1),
(2) Date: Sep. 13, 2021

(87) PCT Pub. No.: WO2021/131957
PCT Pub. Date: Jul. 1, 2021

(65) Prior Publication Data
US 2022/0317191 A1 Oct. 6, 2022

(30) Foreign Application Priority Data
Dec. 26, 2019 (JP) .................................. 2019-237234

(51) Int. Cl.
*G01R 31/389* (2019.01)
*G01R 31/3835* (2019.01)
(Continued)

(52) U.S. Cl.
CPC ......... *G01R 31/389* (2019.01); *G01R 31/367* (2019.01); *G01R 31/374* (2019.01); *G01R 31/3835* (2019.01); *H01M 10/482* (2013.01)

(58) Field of Classification Search
None
See application file for complete search history.

(56) References Cited

U.S. PATENT DOCUMENTS

2006/0170397 A1* 8/2006 Srinivasan ........... G01R 31/392
320/132
2013/0069661 A1* 3/2013 Rich ..................... H01M 10/42
324/433
(Continued)

FOREIGN PATENT DOCUMENTS

JP H09113588 A 5/1997
JP 2007187533 A 7/2007
(Continued)

*Primary Examiner* — Jas A Sanghera
(74) *Attorney, Agent, or Firm* — Holtz, Holtz & Volek PC

(57) ABSTRACT

Provided is a device or the like that can improve the accuracy of battery performance evaluation of a rechargeable battery. Parameter values of a rechargeable battery model are identified on the basis of a measurement result of a complex impedance Z of a first rechargeable battery 221. The rechargeable battery model expresses an impedance of an internal resistance of the first rechargeable battery 221 with transfer functions representing IIR and FIR systems, respectively. Performance of a second rechargeable battery 222 is evaluated on the basis of a result of contrast between a voltage response characteristic V(t) that is output from a rechargeable battery 220 as the second rechargeable battery 222 when an impulse current I(t) is input to the second rechargeable battery 222, and a model voltage response characteristic $V_{model}(t)$ when the impulse current is input to the rechargeable battery model having the parameter values identified.

6 Claims, 8 Drawing Sheets

(51) Int. Cl.
  *G01R 31/367* (2019.01)
  *G01R 31/374* (2019.01)
  *H01M 10/48* (2006.01)

(56) References Cited

U.S. PATENT DOCUMENTS

2022/0091189 A1* 3/2022 Osamura ............ G01R 31/3835
2022/0120817 A1* 4/2022 Okada ................ G01R 31/3842

FOREIGN PATENT DOCUMENTS

| | | | |
|---|---|---|---|
| JP | 2012220199 | A | 12/2012 |
| JP | 2013253784 | A | 12/2013 |
| JP | 5924617 | B2 | 5/2016 |
| JP | 2016085062 | A | 5/2016 |
| WO | 2019187264 | A1 | 10/2019 |

* cited by examiner

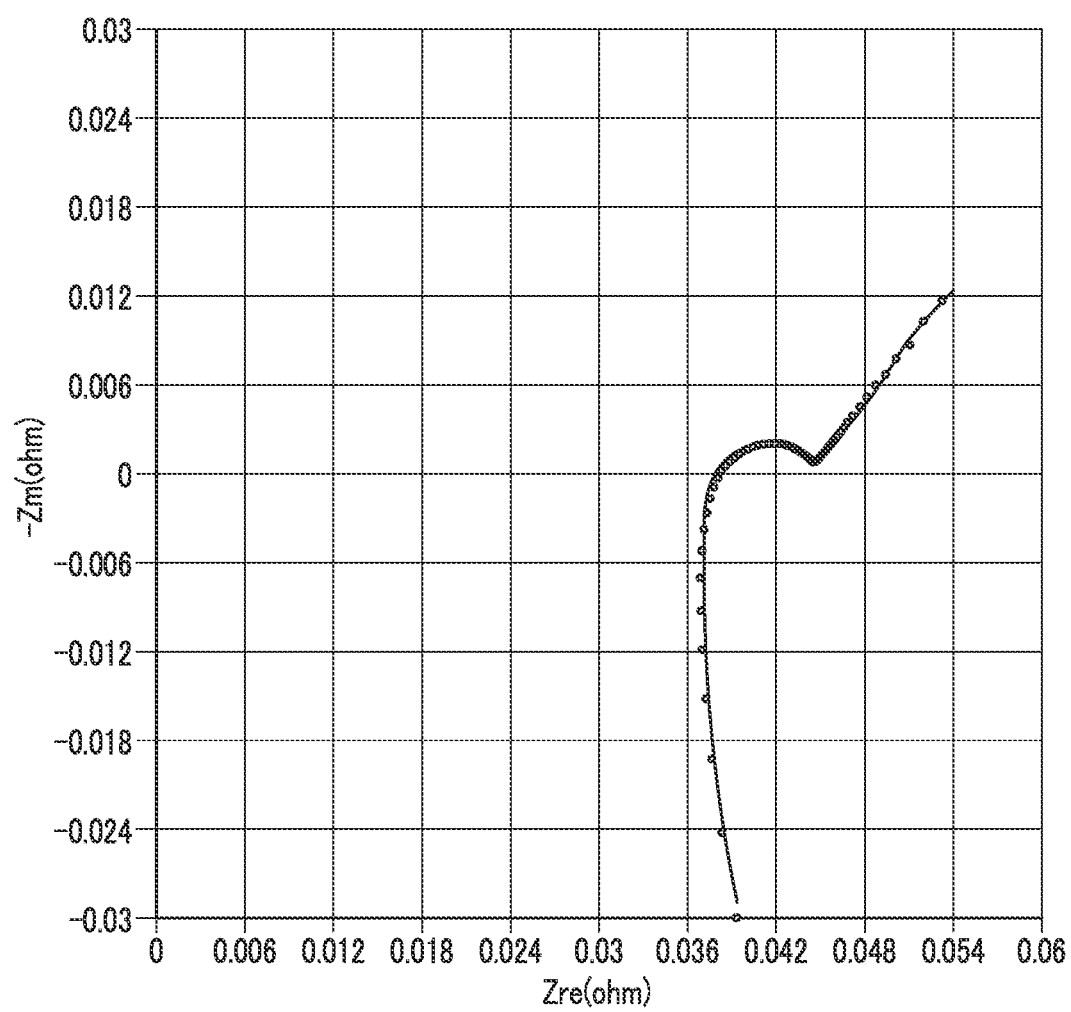

BATTERY PERFORMANCE EVALUATION METHOD AND BATTERY PERFORMANCE EVALUATION DEVICE

CROSS-REFERENCE TO RELATED APPLICATIONS

This patent application is a U.S. National Stage filing of, and claims priority to and all advantages of, PCT Patent Publication Number PCT/JP2020/046937 filed on Dec. 16, 2021 and Japanese Patent Application No. 2019-237234 filed on Dec. 26, 2019, the contents of both of which are incorporated herein by reference in their entireties.

TECHNICAL FIELD

The present invention relates to a technique for evaluating the performance of rechargeable batteries such as lithium-ion batteries.

BACKGROUND ART

Changes in current-voltage behavior waveform of a rechargeable battery are discussed by defining the internal resistance of the rechargeable battery as an equivalent circuit constructed by connecting parallel circuits of resistor R and capacitor C in multiple stages. However, in order to explain the transient response waveform of the voltage for a few or more seconds, a capacitor capacitance value of several 100 F to several 1000 F would have to be used as the time constant element. Such values are not compatible with the AC impedance and its equivalent circuit model used for evaluating the AC characteristics of a battery, and cannot be said to reproduce the battery properties.

The internal resistance is one of the characteristic items of a rechargeable battery. For example, in a lithium-ion rechargeable battery, complicated chemical reactions such as electrode reactions, SEI reactions, ion diffusion reactions, etc. inside the battery occur in an intertwined manner, and the behavior of the battery voltage is not of the kind where Ohm's law can be applied by regarding the internal resistance as a mere DC resistance.

Conventionally, as a method for evaluating the internal resistance of a battery, an AC impedance analysis method based on frequency response analysis (FRA) is well known. A method has been established to interpret various internal reactions by decomposing them into a number of time constant elements by applying an equivalent circuit model. The behavior of a battery on the order of seconds is dominated by the diffusion phenomenon as Warburg resistance, and how well this Warburg resistance is incorporated into an operating model determines the performance as the model. In order to measure the AC impedance, a dedicated device such as a frequency response analyzer (FRA) is required.

CITATION LIST

Patent Literature

Patent Literature 1: Japanese Patent No. 5924617

SUMMARY OF INVENTION

Technical Problem

However, in practical use, the rechargeable battery is connected to a load and is repeatedly charged and discharged. In that case, only voltage, current, and temperature are measured as basic information to know the state of the rechargeable battery. Under these circumstances, the output voltage of the battery is affected by the internal resistance, and the internal resistance itself varies depending on the temperature conditions or the degree of degradation of the battery. There has been a need for a means that analyzes in detail the characteristics of the battery in its actual operating state.

In view of the foregoing, it is an object of the present invention to provide a device or the like that can improve the accuracy of battery performance evaluation of a rechargeable battery.

Solution to Problem

A battery performance evaluation device according to the present invention includes:
 a first recognition element configured to recognize a measurement result of a complex impedance of a first rechargeable battery;
 a first calculation element configured to identify parameter values of a rechargeable battery model on the basis of the measurement result of the complex impedance of the first rechargeable battery recognized by the first recognition element, the rechargeable battery model expressing an impedance of an internal resistance of the first rechargeable battery with transfer functions representing an IIR system and an FIR system, respectively;
 a second recognition element configured to recognize a measured output voltage as a measurement result of a manner of change of a voltage that is output from a second rechargeable battery in response to an impulse current input to the second rechargeable battery, the second rechargeable battery being designed as a rechargeable battery that is identical in performance to the first rechargeable battery in an initial state;
 a second calculation element configured to calculate a model output voltage as a manner of change of a voltage that is output from the rechargeable battery model having the parameter values identified by the first calculation element in response to the impulse current input to the rechargeable battery model; and
 a battery performance evaluation element configured to evaluate performance of the second rechargeable battery on the basis of a result of contrast between the measured output voltage recognized by the second recognition element and the model output voltage calculated by the second calculation element.

In the battery performance evaluation device of the present invention, it is preferable that
 the first recognition element recognizes measurement results of the complex impedance of the first rechargeable battery at different temperatures, and the first calculation element specifies temperature dependence of the parameter values of the rechargeable battery model on the basis of the measurement results of the complex impedance of the first rechargeable battery at the different temperatures recognized by the first recognition element, and
 the second recognition element recognizes a measurement result of a temperature of the second rechargeable battery in addition to the output voltage of the second rechargeable battery, and the second calculation element calculates the model output voltage in the case where the measurement result of the temperature of the second rechargeable battery recognized by the second recognition element as well as the impulse current are input to the rechargeable battery model having the parameter values and the temperature dependence of the parameter values identified by the first calculation element.

BRIEF DESCRIPTION OF DRAWINGS

FIG. 4 is a diagram illustrating a Nyquist plot of a rechargeable battery;

DESCRIPTION OF EMBODIMENTS (Configuration of Battery Performance Evaluation Device)

Figure 1:
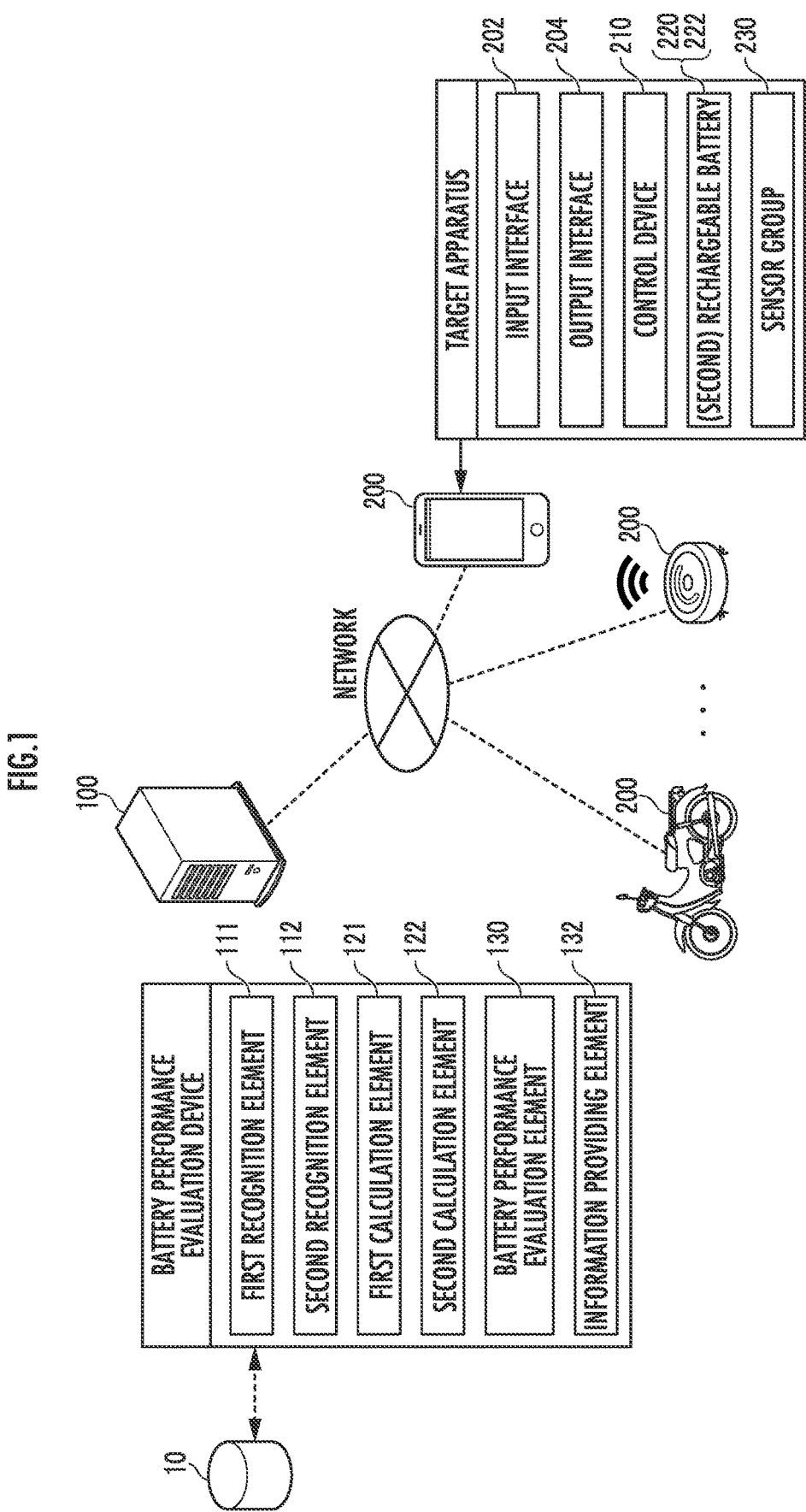
FIG. 1 is a diagram illustrating the configuration of a battery performance evaluation device as an embodiment of the present invention.

The battery performance evaluation device 100 as an embodiment of the present invention shown in FIG. 1 is composed of one or more servers that can communicate with each of a database 10 and a target apparatus 200 via a network. The battery performance evaluation device 100 evaluates the performance of a rechargeable battery 220 installed as a power supply in the target apparatus 200.

The battery performance evaluation device 100 includes a first recognition element 111, a second recognition element 112, a first calculation element 121, a second calculation element 122, a battery performance evaluation element 130, and an information providing element 132. The first recognition element 111, the second recognition element 112, the first calculation element 121, the second calculation element 122, the battery performance evaluation element 130, and the information providing element 132 are each composed of a processor (arithmetic processing unit), a memory (storage device), an I/O circuit, and others. The memory or a separate storage device stores and retains various data such as measurement results of voltage response characteristics of the rechargeable battery 220 with respect to an impulse current, as well as programs (software). For example, a plurality of identifiers each identifying the type (as specified by standards and specifications) of a rechargeable battery 220 or a target apparatus 200 in which the rechargeable battery 220 is installed and a plurality of rechargeable battery models are associated respectively, and stored and retained in the memory. The processor reads the necessary program and data from the memory and executes arithmetic processing in accordance with the program on the basis of the data, thereby executing the arithmetic processing or tasks (described below) assigned to the respective elements 111, 112, 121, 122, 130, and 132.

The target apparatus 200 includes an input interface 202, an output interface 204, a control device 210, a rechargeable battery 220, and a sensor group 230. The target apparatus 200 includes any apparatus that uses the rechargeable battery 220 as a power supply, such as a personal computer, cellular phone (smartphone), home appliance, or mobile body such as an electric bicycle.

The control device 210 is composed of a processor (arithmetic processing unit), a memory (storage device), an I/O circuit, and others. The memory or a separate storage device stores and retains various data such as the measurement of the voltage response characteristics of the rechargeable battery 220. The control device 210 operates in response to the power supplied from the rechargeable battery 220 and controls the operation of the target apparatus 200 in the energized state. The operation of the target apparatus 200 includes the operation of an actuator (such as electric actuator) that constitutes the target apparatus 200. The processor constituting the control device 210 reads the necessary program and data from the memory, and executes the arithmetic processing assigned in accordance with the program on the basis of the data.

The rechargeable battery 220 is, for example, a lithium-ion battery, and may be any other rechargeable battery such as a nickel-cadmium battery. The sensor group 230 measures the voltage response characteristics and temperature of the rechargeable battery 220, as well as the values of parameters necessary for controlling the target apparatus 200. The sensor group 230 includes, for example, a voltage sensor, a current sensor, and a temperature sensor that output signals corresponding to the voltage, current, and temperature, respectively, of the rechargeable battery 220.

The battery performance evaluation device 100 may be mounted on the target apparatus 200. In this case, a software server (not shown) may transmit degradation determining software to the arithmetic processing unit constituting the control device 210 included in the target apparatus 200, thereby imparting functions as the battery performance evaluation device 100 to the arithmetic processing unit.

(Battery Performance Evaluation Method)

A description will now be made of a battery performance evaluation method of a rechargeable battery 220, which is performed by the battery performance evaluation device 100 of the above configuration.

(Recognition of Measurement Results of Complex Impedance)

Figure 2:
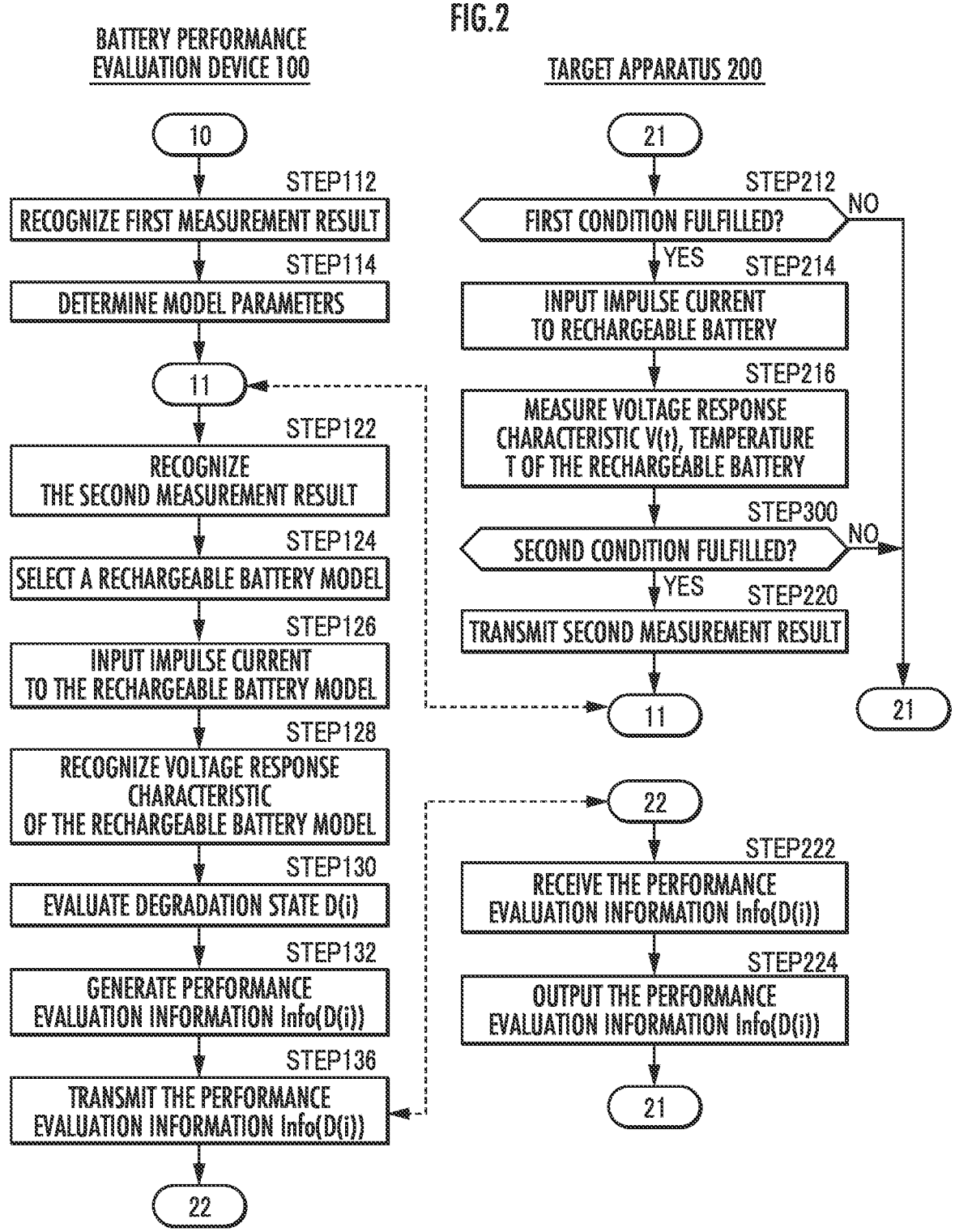
FIG. 2 is a flowchart illustrating the procedure of a battery performance evaluation method of a rechargeable battery.

In the battery performance evaluation device 100, the first recognition element 111 recognizes measurement results of the complex impedance Z of various types of rechargeable batteries (first rechargeable batteries 221) (STEP 112 in FIG. 2). For each element to "recognize" information means to perform any arithmetic processing, etc. for preparing necessary information, which includes to receive information, to retrieve or read information from the database 10 or other information source, and to calculate or estimate information on the basis of other information. The complex impedance Z of a first rechargeable battery 221 is measured with the AC impedance method, and the measurement result is registered in the database 10 in association with an identifier for identifying the type of the first rechargeable battery 221.

Figure 3:
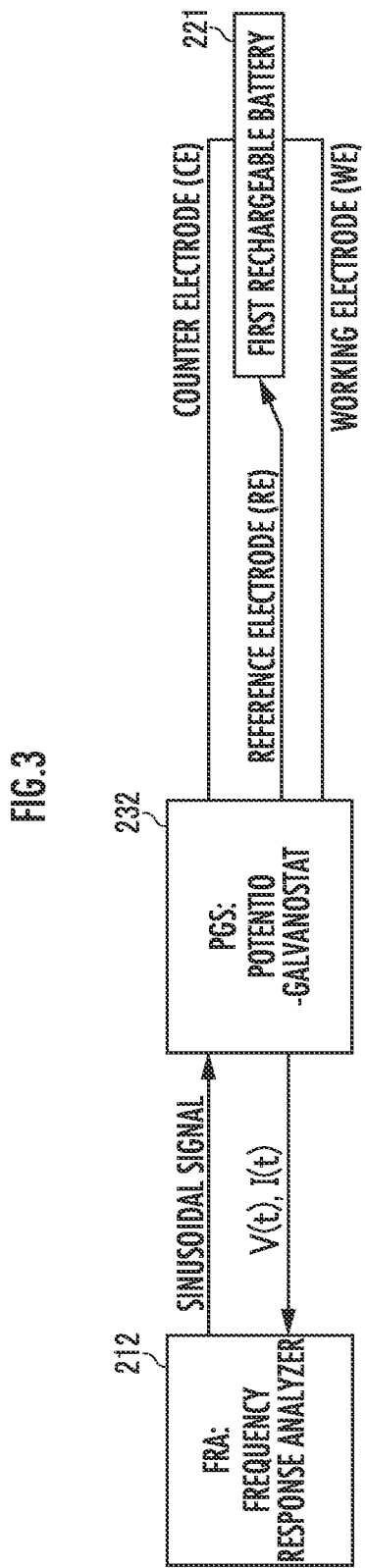
FIG. 3 is a diagram illustrating a system for measuring a complex impedance of a rechargeable battery.

According to the AC impedance method, a combination of a frequency response analyzer (FRA) 212 and a potentio-galvanostat (PGS) 232 is used, as shown in FIG. 3. An oscillator constituting the FRA 212 outputs a sinusoidal signal of an arbitrary frequency, and a current signal I(t) and a voltage signal V(t) of the first rechargeable battery 221 in response to the sinusoidal signal are input from the PGS 232 to the FRA 212. In the FRA 212, the current signal I(t) and the voltage signal V(t) are converted into frequency domain data by means of discrete Fourier frequency transform, and the complex impedance Z at the frequency f=(ω/2π) is measured.

For example, the complex impedance Z of the first rechargeable battery 221 in the state of not being installed in the target apparatus 200, such as immediately before shipment of the rechargeable battery 220, is measured. Alternatively, the complex impedance Z of the rechargeable battery 220 as the first rechargeable battery 221 in the state of being installed in the target apparatus 200 may be measured. In this case, the FRA 212 may be configured with the control device 210, and the sensor group 230 may be configured with the PGS. For example, the target apparatus 200 may be connected to a power supply such as a commercial power supply for the purpose of charging the rechargeable battery 220, and a sinusoidal signal may be output with the power supplied from the power supply.

FIG. 4 shows an example of a Nyquist plot representing the actual measurement results of the complex impedance Z of the first rechargeable battery 221, together with an approximate curve of the plot. The horizontal axis represents real part ReZ of the complex impedance Z, and the vertical axis represents imaginary part −ImZ of the complex impedance Z. The larger ReZ in the region of −ImZ>0 represents the complex impedance Z at lower frequencies. The value of ReZ when −ImZ=0 corresponds to the transfer resistance in the electrolytic solution of the first rechargeable battery 221. The radius of curvature of the approximately semicircular portion in the region of −ImZ>0 corresponds to the charge transfer resistance of the first rechargeable battery 221. The radius of curvature tends to become smaller as the temperature T of the first rechargeable battery 221 becomes higher. The linear portion rising at about 45° in the low frequency region of the region of −ImZ>0 reflects the effect of the Warburg impedance of the first rechargeable battery 221.

(Establishment of Rechargeable Battery Model)

In the battery performance evaluation device 100, parameter values of a rechargeable battery model are identified by the first calculation element 121 on the basis of the measurement result of the complex impedance Z of the first rechargeable battery 221 recognized by the first recognition element 111 (STEP 114 in FIG. 2).

The rechargeable battery model is a model that expresses a voltage V(t) output from a rechargeable battery 220 when a current I(t) is input to the rechargeable battery 220. It is defined using an open-circuit voltage OCV and a transfer function H(t) of the internal resistance of the rechargeable battery 220 by the relational expression (01).

$$V(t)=OCV(t)+H(t)\cdot I(t) \quad (01)$$

Here, OCV(t) indicates that the open-circuit voltage increases or decreases as the current I(t) is charged and/or discharged.

A transfer function H(z) of an equivalent circuit model of the internal resistance of a rechargeable battery is defined by the relational expression (02).

$$H(t)=H_0(t)+\Sigma_{i=1\sim m}H_i(t)+H_w(t)+H_L(t) \quad (02)$$

Here, "$H_0(t)$", "$H_i(t)$", "$H_w(t)$", and "$H_L(t)$" are defined by parameters that represent the characteristics of the internal resistance of the rechargeable battery.

Figure 5A:
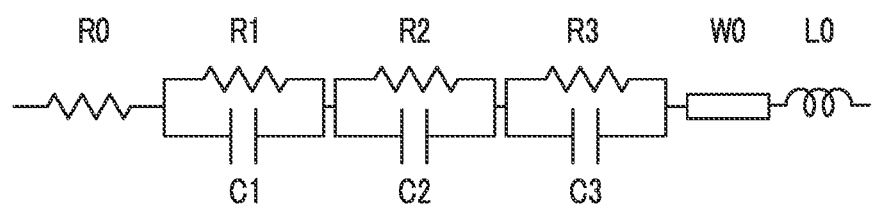
FIG. 5A is a diagram illustrating a first example of the equivalent circuit of the internal resistance of a rechargeable battery.
Figure 5B:
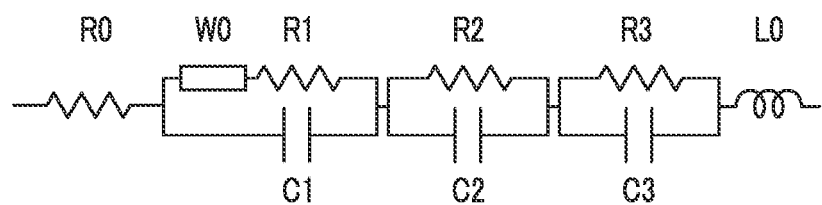
FIG. 5B is a diagram illustrating a second example of the equivalent circuit of the internal resistance of a rechargeable battery.

FIG. 5A shows an example of an equivalent circuit of the internal resistance of the rechargeable battery 220. In this example, the equivalent circuit of the internal resistance is defined by a series circuit of: a resistor $R_0$, corresponding to the transfer resistance in the electrolytic solution; the i-th RC parallel circuit (i=1, 2, . . . , m) consisting of a resistor $R_i$ and a capacitor $C_i$, corresponding to the charge transfer resistance; a resistor $W_0$, corresponding to the Warburg impedance; and a coil L. Although the number of series-connected RC parallel circuits is "3" in the example shown in FIG. 5A, it can be smaller or larger than 3. The resistor $W_0$ may be connected in series with the resistor R in at least one RC parallel circuit. The capacitor C may be replaced by a constant phase element (CPE). As shown in FIG. 5B, the Warburg resistor, $W_0$, may be connected in series with the resistor R in at least one RC parallel circuit (the first RC parallel circuit in the example of FIG. 5B).

The transfer function $H_0(z)$ of the resistor $R_0$ is defined by the relational expression (031).

$$H_0(z)=R_0 \quad (031)$$

Figure 6A:
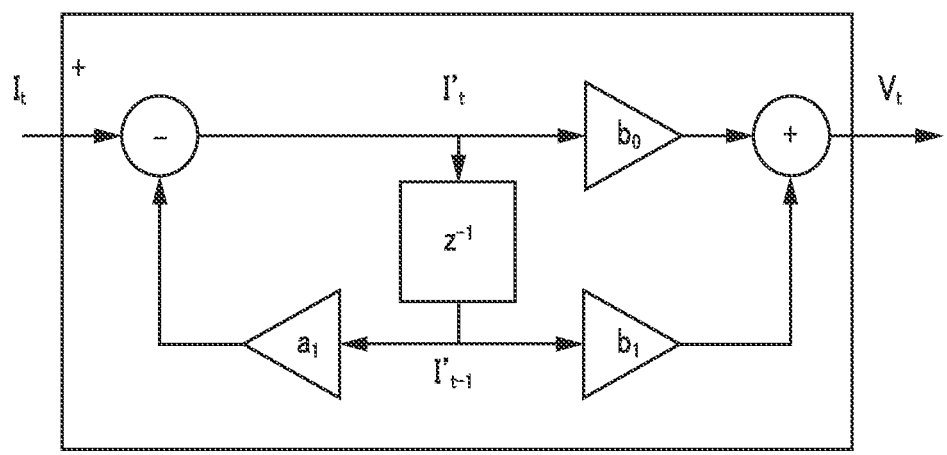
FIG. 6A is a diagram representing the transfer function of an IIR system.

The transfer function $H_i(z)$ of the i-th RC parallel circuit is defined as a transfer function of an infinite impulse response (IIR) system by the relational expression (032). FIG. 6A shows a block diagram representing the transfer function $H_i(z)$ of the i-th RC parallel circuit.

$$H_i(z)=(b_0+b_i z^{-1})/(1+a_i z^{-1}) \quad (032)$$

Figure 6B:
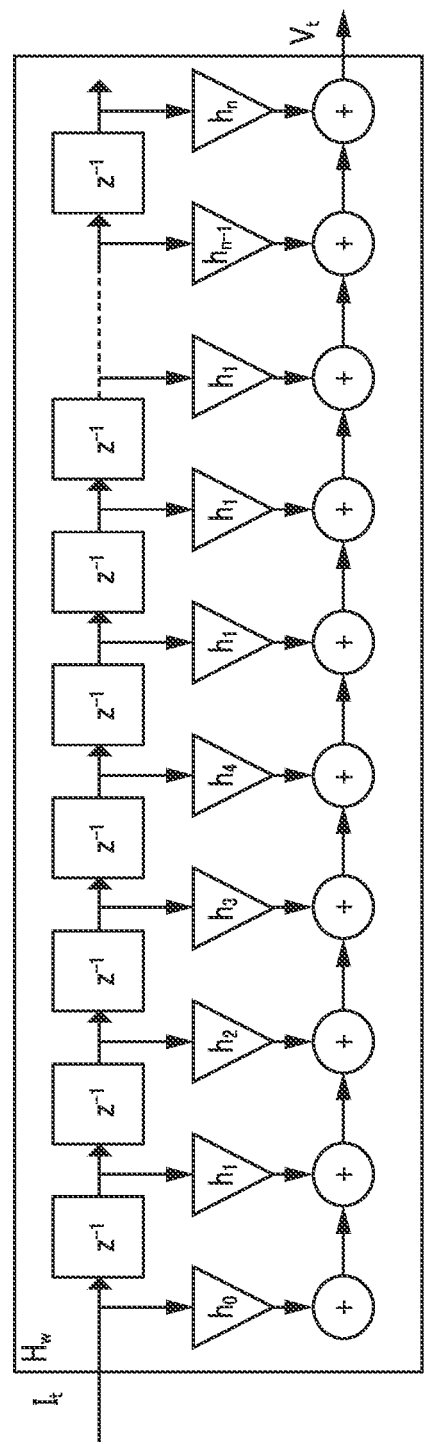
FIG. 6B is a diagram representing the transfer function of an FIR system.

The transfer function $H_W(z)$ of the resistor $W_0$ corresponding to the Warburg impedance is defined as a transfer function of a finite impulse response (FIR) system by the relational expression (04). FIG. 6B shows a block diagram representing the transfer function $H_W(z)$ of the resistor $W_0$ corresponding to the Warburg impedance.

$$H_W(z)=\Sigma_{k=0\sim n}h_k z^{-k} \quad (04)$$

The transfer function $H_L(z)$ of the coil L is defined by the relational expression (05).

$$H_L(z)=(2L_0/T)(1-z^{-1})/(1+z^{-1}) \quad (05)$$

An approximate curve of the complex impedance Z of the rechargeable battery represented by the Nyquist plot, shown with a solid line in FIG. 4, is obtained under the assumption that the transfer function H(z) of the equivalent circuit model of the internal resistance of the rechargeable battery is defined according to the relational expression (02). This allows the values of the parameters $R_0$, $a_i$, $b_0$, $h_k$, $L_0$, and T to be obtained (see the relational expressions (03) to (05)). The value of the open-circuit voltage OCV in the rechargeable battery model is identified by the measurement value of the open-circuit voltage OCV (see the relational expression (01)). Then, depending on the values of the parameters, the rechargeable battery models are established for various types of rechargeable batteries 220.

(Rechargeable Battery Performance Evaluation)

In the target apparatus 200, the control device 210 in the energized state determines whether a first condition is satisfied (STEP 212 in FIG. 2). The "first condition" adopted is, for example, that a request for evaluating the battery performance of the rechargeable battery 220 has been received through the input interface 202 in the target apparatus 200, that the target apparatus 200 has been connected to an external power supply for the purpose of charging the rechargeable battery 220, or the like.

If it is determined that the first condition is not satisfied (NO in STEP 212 in FIG. 2), the process of determining the fulfillment of the first condition is performed again (STEP 212 in FIG. 2). The process of determining the fulfillment of the first condition (STEP 212 in FIG. 2) may be omitted.

Figure 7A:
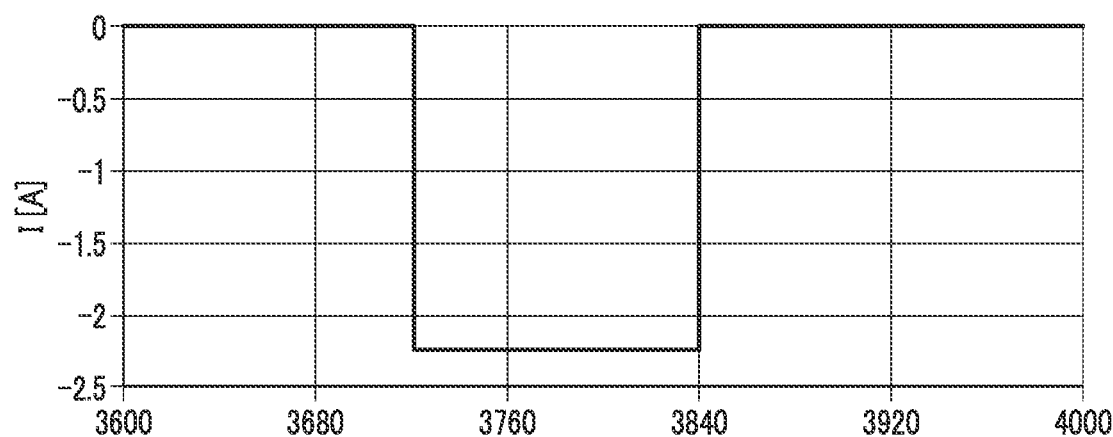
FIG. 7A is a diagram illustrating an impulse current.

If it is determined that the first condition is satisfied (YES in STEP 212 in FIG. 2), an impulse current I(t) as shown in FIG. 7A is input to the rechargeable battery 220 (STEP 214 in FIG. 2). The waveform signal of the impulse current I(t) may be the one designated by the second recognition element 112 through mutual communication between the battery performance evaluation device 100 and the target apparatus 200. For example, with a pulse current generator installed in the target apparatus 200 being driven by power supplied from an external power supply to which the target apparatus 200 is connected, the impulse current I(t) generated in the pulse current generator is input to the rechargeable battery 220. An auxiliary power supply for impulse current generation may be installed in the target apparatus 200.

The control device 210 measures a voltage response characteristic V(t) and a temperature T of the rechargeable battery 220 on the basis of the output signals of the sensor group 230 (STEP 216 in FIG. 2). As such, the voltage response characteristic V(t) of the rechargeable battery 220 which varies as shown by the solid line in FIG. 7B, for example, is measured.

Subsequently, the control device 210 determines whether a second condition is satisfied (STEP 218 in FIG. 2). The "second condition" adopted is, for example, that a waveform signal sufficient to specify the voltage response characteristic V(t) has been acquired, that a second time point has been reached after a lapse of a predetermined time since a first time point when the first condition was last determined to have been satisfied, that a request for battery performance evaluation of the rechargeable battery 220 has been received through the input interface 202 in the target apparatus 200, or the like.

If it is determined that the second condition is not satisfied (NO in STEP 218 in FIG. 2), the process of determining the fulfillment of the first condition is performed again (STEP 212 in FIG. 2). The process of determining the fulfillment of the second condition (STEP 218 in FIG. 2) may be omitted.

If it is determined that the second condition is satisfied (YES in STEP 218 in FIG. 2), the measurement results of the voltage response characteristic V(t) and the temperature T of the rechargeable battery 220 are transmitted from the target apparatus 200 to the battery performance evaluation device 100 by a transmitting device that constitutes the output interface 204 (STEP 220 in FIG. 2). At this time, an identifier ID for identifying the type (standard, specification) of the rechargeable battery 220 is also transmitted from the target apparatus 200 to the battery performance evaluation device 100. In addition, measurement condition information for specifying the impulse current I(t) input to the rechargeable battery 220 when the voltage response characteristic V(t) was measured may be transmitted from the target apparatus 200 to the battery performance evaluation device 100.

In the battery performance evaluation device 100, the second recognition element 112 recognizes the measurement results of the voltage response characteristic V(t) and the temperature T of the rechargeable battery 220 as a second measurement result (STEP 122 in FIG. 2).

The second calculation element 122 selects, from among a large number of rechargeable battery models registered in the database 10, one rechargeable battery model that is associated with both of the identifier ID assigned to the second measurement result and the measurement result of the temperature T included in the second measurement result (STEP 124 in FIG. 2).

Further, the second calculation element 122 inputs an impulse current I(t) to the selected rechargeable battery model (STEP 126 in FIG. 2). The impulse current I(t) may be recognized on the basis of the waveform signal designated by the second recognition element 112, or on the basis of the measurement condition information transmitted from the target apparatus 200 to the battery performance evaluation device 100.

Figure 7B:
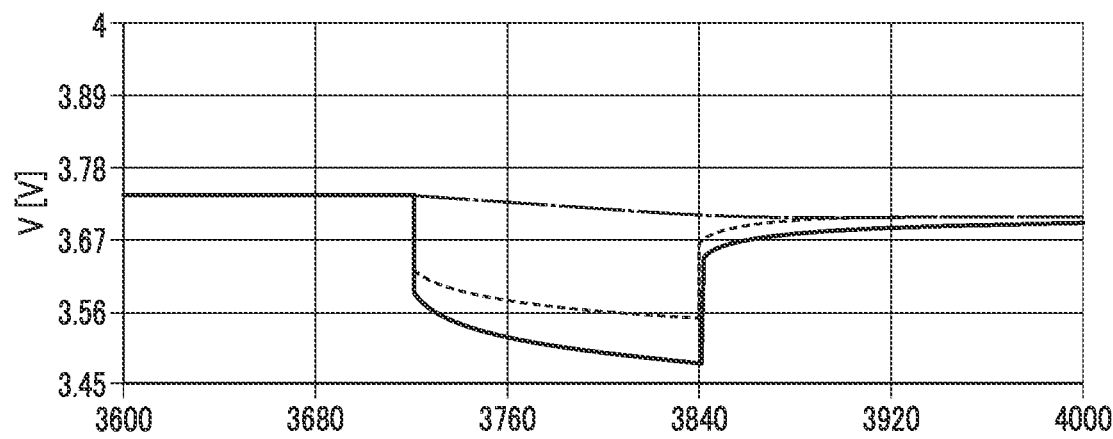
FIG. 7B is a diagram illustrating the voltage response characteristics of a rechargeable battery and a rechargeable battery model.

The second calculation element 122 calculates a voltage response characteristic $V_{model}(t)$ to be output from the rechargeable battery model, as an output signal of the rechargeable battery model (STEP 128 in FIG. 2). With this, the voltage response characteristic $V_{model}(t)$ of the rechargeable battery model that changes as shown by the broken line in FIG. 7B, for example, is calculated as the output signal of the rechargeable battery model. In FIG. 7B, the manner of change of the open-circuit voltage OCV(t) is shown by the dash-dotted line.

Subsequently, the battery performance evaluation element 130 evaluates the performance of the rechargeable battery 220 (second rechargeable battery 222) on the basis of the result of contrast between the voltage response characteristic V(t) of the rechargeable battery 220 and the voltage response characteristic $V_{model}(t)$ of the rechargeable battery model (STEP 130 in FIG. 2). For example, the similarity x between the curve representing the voltage response characteristic V(t) of the rechargeable battery 220 (second rechargeable battery 222) and the curve representing the voltage response characteristic $V_{model}(t)$ of the rechargeable battery model is calculated. Then, in accordance with a decreasing function f with the similarity x as the main variable, the degradation degree D(i)=f(x) of the rechargeable battery 220 is calculated (where "i" represents an index meaning the type of the rechargeable battery 220).

The battery performance evaluation element 130 generates degradation diagnosis information Info(D(i)) according to the degradation degree D(i) of the rechargeable battery 220 (STEP 132 in FIG. 2). The battery performance evaluation element 130 transmits the diagnosis information Info (D(i)) from the battery performance evaluation device 100 to the target apparatus 200 (STEP 134 in FIG. 2).

In the target apparatus 200, the degradation diagnosis information Info(D(i)) is received by a receiving device that constitutes the input interface 202 (STEP 222 in FIG. 2). The degradation diagnosis information Info(D(i)) is output to and displayed on a display device that constitutes the output interface 204 (STEP 224 in FIG. 2). With this, a graph showing the degradation degree D(i) of the rechargeable battery 220 is displayed on the display device, as well as a message regarding the measures to be taken depending on the degradation degree D(i), such as: "The battery degradation degree is 30%. Replacement is recommended in the next 150 days."

Another Embodiment of the Present Invention

In the above embodiment, a rechargeable battery model was selected taking account of the temperatures T at the times of measurement of the voltage response characteristics V(t) of the first and second rechargeable batteries 221 and 222, respectively, and the performance of the second rechargeable battery 222 was evaluated. Alternatively, as another embodiment, the performance of the second rechargeable battery 222 may be evaluated by selecting a rechargeable battery model on the basis of the identifier representing the type, while taking no account of the temperatures T at the times of measurement of the voltage response characteristics V(t) of the first and second rechargeable batteries 221 and 222, respectively.

Effects of the Invention

According to the battery performance evaluation device 100 and the battery performance evaluation method performed by the same according to the present invention, the values of parameters of the rechargeable battery model are identified on the basis of the measurement result of the complex impedance Z of the first rechargeable battery 221 (see STEP 112 to STEP 114 in FIG. 2; FIGS. 2 to 4, 5A, 5B, 6A, and 6B). The rechargeable battery model expresses the impedance of the internal resistance of the first rechargeable battery 221 by the transfer functions that represent the IIR and FIR systems, respectively (see the relational expressions (03) and (04); FIGS. 2 to 4, 5A, 5B, 6A, and 6B). Further, the performance of the second rechargeable battery 222 is evaluated on the basis of the result of contrast between the voltage response characteristic V(t) that is output from the rechargeable battery 220 as the second rechargeable battery 222 when the impulse current I(t) is input to the second rechargeable battery 222, and the model voltage response characteristic $V_{model}(t)$ when the impulse current is input to the rechargeable battery model having the parameter values identified (see FIG. 7B).

Since the second rechargeable battery 222 is designed as a rechargeable battery 220 that is identical in performance to the first rechargeable battery 221 in the initial state, the performance of the second rechargeable battery 222 with respect to the performance of the first rechargeable battery 221 may be evaluated. For example, in the case where the first rechargeable battery 221 is the same rechargeable battery 220 as the second rechargeable battery 222, the degradation state of the battery at the time when the response characteristic to the impulse current I(t) was measured as the second rechargeable battery 222 may be determined with respect to the initial state of the first rechargeable battery 221.

DESCRIPTION OF REFERENCE NUMERALS

10: database; 100: battery performance evaluation device; 111: first recognition element; 112: second recognition element; 121: first calculation element; 122: second calculation element; 130: battery performance evaluation element; 200: target apparatus; 202: input interface; 204: output interface; 210: control device; 220: rechargeable battery; 221: first rechargeable battery; 222: second rechargeable battery; and 230: sensor group.

The invention claimed is:

1. A battery performance evaluation device comprising:
a first recognition element configured to recognize a measurement result of a complex impedance of a first rechargeable battery;
a first calculation element configured to identify parameter values of a rechargeable battery model based on the measurement result of the complex impedance of the first rechargeable battery recognized by the first recognition element, the rechargeable battery model expressing an impedance of an internal resistance of the first rechargeable battery with transfer functions representing an IIR system and an FIR system, respectively;
a second recognition element configured to recognize a measured output voltage as a measurement result of a manner of change of a voltage that is output from a second rechargeable battery in response to an impulse current input to the second rechargeable battery, the second rechargeable battery being designed as a rechargeable battery that is identical in performance to the first rechargeable battery in an initial state;
a second calculation element configured to calculate a single model output voltage as a manner of change of a voltage that is output from the rechargeable battery model having the parameter values identified by the first calculation element in response to the impulse current input to the rechargeable battery model; and
a battery performance evaluation element configured to evaluate performance of the second rechargeable battery based on a similarity between the measured output voltage recognized by the second recognition element and the single model output voltage calculated by the second calculation element.

2. The battery performance evaluation device according to claim 1, wherein:
the first recognition element recognizes measurement results of the complex impedance of the first rechargeable battery at different temperatures,
the first calculation element specifies temperature dependence of the parameter values of the rechargeable battery model based on the measurement results of the complex impedance of the first rechargeable battery at the different temperatures recognized by the first recognition element,
the second recognition element recognizes a measurement result of a temperature of the second rechargeable battery in addition to the output voltage of the second rechargeable battery, and
the second calculation element calculates the single model output voltage in a case where the measurement result of the temperature of the second rechargeable battery recognized by the second recognition element as well as the impulse current are input to the rechargeable battery model having the parameter values and the temperature dependence of the parameter values specified by the first calculation element.

3. The battery performance evaluation device according to claim 1, wherein the first recognition element, based on a mutual communication with a first target apparatus having the first rechargeable battery mounted thereon as a power supply, recognizes the complex impedance of the first rechargeable battery measured in accordance with an AC impedance method by a measuring instrument mounted on the first target apparatus.

4. The battery performance evaluation device according to claim 1, wherein the second recognition element, based on a mutual communication with a second target apparatus having the second rechargeable battery mounted thereon as a power supply, recognizes a voltage response characteristic of the second rechargeable battery measured by a sensor mounted on the second target apparatus in response to an impulse current generated by an impulse current generator mounted on the second target apparatus.

5. A battery performance evaluation method comprising:
a first recognition step of recognizing a measurement result of a complex impedance of a first rechargeable battery;
a first calculation step of identifying parameter values of a rechargeable battery model based on the measurement result of the complex impedance of the first rechargeable battery recognized in the first recognition step, the rechargeable battery model expressing an impedance of an internal resistance of the first rechargeable battery with transfer functions representing an IIR system and an FIR system, respectively;

a second recognition step of recognizing a measured output voltage as a measurement result of a manner of change of a voltage that is output from a second rechargeable battery in response to an impulse current input to the second rechargeable battery, the second rechargeable battery being designed as a rechargeable battery that is identical in performance to the first rechargeable battery in an initial state;

a second calculation step of calculating a single model output voltage as a manner of change of a voltage that is output from the rechargeable battery model having the parameter values identified in the first calculation step in response to the impulse current input to the rechargeable battery model; and a battery performance evaluation step of evaluating performance of the second rechargeable battery based on a similarity between the measured output voltage recognized in the second recognition step and the single model output voltage calculated in the second calculation step.

6. The battery performance evaluation method according to claim 5, wherein:

the first recognition step includes recognizing measurement results of the complex impedance of the first rechargeable battery at different temperatures, the first calculation step includes specifying temperature dependence of the parameter values of the rechargeable battery model based on the measurement results of the complex impedance of the first rechargeable battery at the different temperatures recognized in the first recognition step, the second recognition step includes recognizing a measurement result of a temperature of the second rechargeable battery in addition to the output voltage of the second rechargeable battery, and the second calculation step includes calculating the single model output voltage in a case where the measurement result of the temperature of the second rechargeable battery recognized in the second recognition step as well as the impulse current are input to the rechargeable battery model having the parameter values and the temperature dependence of the parameter values specified in the first calculation step.

* * * * *